(12) United States Patent
Tsyrganovich et al.

(10) Patent No.: US 10,439,483 B2
(45) Date of Patent: *Oct. 8, 2019

(54) GATE DRIVER FOR SWITCHING CONVERTER HAVING BODY DIODE POWER LOSS MINIMIZATION

(71) Applicant: Littelfuse, Inc., Chicago, IL (US)

(72) Inventors: Anatoliy V. Tsyrganovich, Woodside, CA (US); Leonid A. Neyman, Sunnyvale, CA (US); Md Abdus Sattar, Pleasanton, CA (US); Vladimir Tsukanov, Los Altos Hills, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/149,745

(22) Filed: Oct. 2, 2018

(65) Prior Publication Data

US 2019/0260281 A1 Aug. 22, 2019

Related U.S. Application Data

(63) Continuation of application No. 15/901,829, filed on Feb. 21, 2018, now Pat. No. 10,090,751.

(51) Int. Cl.
*H02M 7/537* (2006.01)
*H02M 1/08* (2006.01)
(Continued)

(52) U.S. Cl.
CPC .............. *H02M 1/08* (2013.01); *H02M 7/537* (2013.01); *H03K 3/012* (2013.01); *H03K 17/0822* (2013.01); *H03K 17/162* (2013.01); *H03K 17/687* (2013.01); *H02M 2001/0051* (2013.01); *H02M 2001/0054* (2013.01); *H02M 2001/0058* (2013.01); *H03K 17/04123* (2013.01);
(Continued)

(58) Field of Classification Search
CPC ........ H02M 1/08; H02M 1/088; H02M 1/096; H02M 7/537; H02M 2001/0051; H02M 2001/0054; H02M 2001/0058; H03K 3/012; H03K 17/687; H03K 17/6871; H03K 2217/0063; H03K 2217/0072
See application file for complete search history.

(56) References Cited

U.S. PATENT DOCUMENTS

9,590,616 B2 3/2017 Inoue et al.
9,813,055 B2 11/2017 Laschek-Enders
(Continued)

*Primary Examiner* — Patrick O Neill (57) ABSTRACT

In a switching converter having an inductive load, a current may flow through the body diode of a transistor even though the gate of the transistor is being controlled to keep the transistor off. Then when the other transistor of the switch leg is turned on, a reverse recovery current flows in the reverse direction through the body diode. To reduce switching losses associated with such current flows, a gate driver integrated circuit detects when current flow through the body diode rises above a threshold current. The gate driver integrated circuit then controls the transistor to turn on. Then when the other transistor of the switch leg is made to turn on, the gate driver first turns the transistor off. When the gate-to-source voltage of the turning off transistor drops below a threshold voltage, then the gate driver integrated circuit allows and controls the other transistor to turn on.

10 Claims, 8 Drawing Sheets

(51) Int. Cl.
*H03K 3/012* (2006.01)
*H03K 17/082* (2006.01)
*H03K 17/16* (2006.01)
*H03K 17/687* (2006.01)
H03K 17/0412 (2006.01)
H02M 1/00 (2006.01)

(52) U.S. Cl.
CPC ............... *H03K 2217/0063* (2013.01); *H03K 2217/0072* (2013.01); *Y02B 70/1491* (2013.01)

(56) References Cited

U.S. PATENT DOCUMENTS 10,090,751 B1 * 10/2018 Tsyrganovich ......... H02M 1/08
2014/0253182 A1 9/2014 Akiyama et al.

* cited by examiner

LOW SIDE TRANSISTOR ON
(PRIOR ART)
FIG. 1A

LOW SIDE TRANSISTOR TURNED OFF
(PRIOR ART)
FIG. 1B

LOW SIDE TRANSISTOR TURNED ON
(PRIOR ART)
FIG. 1C

LOW SIDE TRANSISTOR STAYS ON
(PRIOR ART)
FIG. 1D

HS DRIVER LOGIC

FIG. 4

SERIAL DIGITAL INTERFACE

GATE DRIVER FOR SWITCHING CONVERTER HAVING BODY DIODE POWER LOSS MINIMIZATION

CROSS-REFERENCE

This application is a continuation of, and claims priority under 35 U.S.C. SS 120 from, nonprovisional U.S. patent application Ser. No. 15/901,829 entitled "Gate Driver for Switching Converter Having Body Diode Power Loss Minimization," filed on Feb. 21, 2018, now U.S. Pat. No. 10,090,751, the subject matter of which is incorporated herein by reference.

TECHNICAL FIELD

The described embodiments relate to gate drivers for driving the gates of power transistors such as power field effect transistors (so-called MOSFETs).

BACKGROUND INFORMATION

Figure 1A:
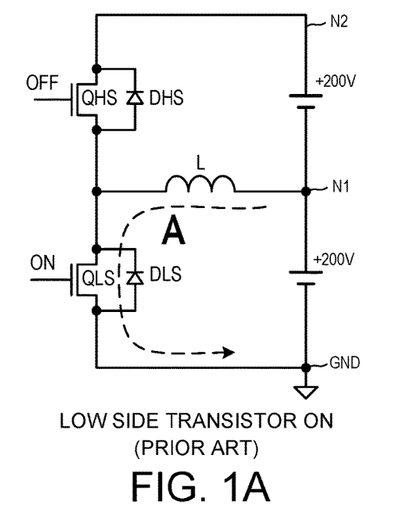
FIG. 1A (Prior Art) is a diagram that illustrates current flow in a DC-to-AC inverter circuit when a low-side transistor is on and conductive.
Figure 1B:
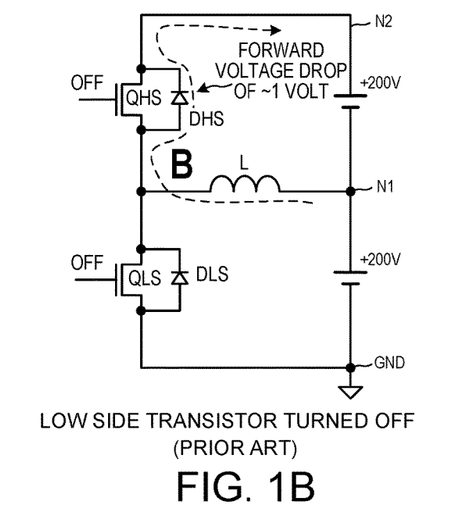
FIG. 1B (Prior Art) is a diagram that illustrates current flow in the DC-to-AC inverter circuit of FIG. 1A when the low-side transistor is turned off.
Figure 1C:
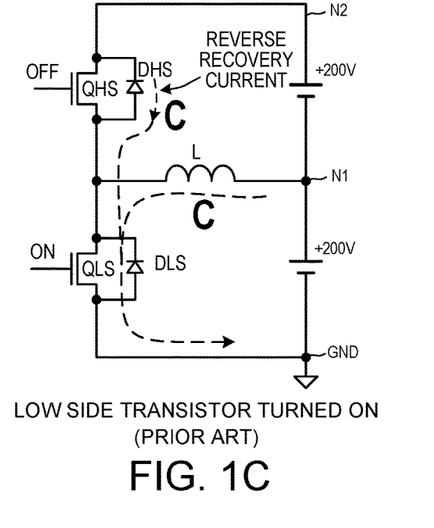
FIG. 1C (Prior Art) is a diagram that illustrates current flow in the inverter circuit of FIG. 1A when the low-side transistor is turned on again.

There are several types of power losses in switching power converters. To illustrate this, one particular type of switching converter is described briefly here. It is a DC-to-AC switching converter typically called an "inverter". An inverter receives a DC supply voltage and outputs a sinusoidal AC voltage or current. There are various circuit topologies for inverters, but FIG. 1A illustrates one example of part of one exemplary inverter circuit. The inverter circuit involves a so-called "high-side" transistor designated QHS and a so-called "low-side" transistor designated QLS. Each of these transistors is an N-channel field effect transistor which is sometimes colloquially called an N-channel MOSFET (Metal-Oxide Semiconductor Field Effect Transistor). Each of these transistors is realized as part of a semiconductor die. There is an inherent body diode that is a part of that die. The diode may be illustrated in the symbol of the N-channel transistor, or it may not be illustrated at all, but it is present along with the transistor. In the inverter circuit, there is a first DC supply voltage present on node N1, and a second higher DC supply voltage present on node N2. Node GND is a ground node. The reference numeral L identifies the first winding (primary-side winding) of a transformer. The core of the transformer and the second winding (secondary-side winding) of the transformer are not shown. The overall purpose of the inverter circuit is to generate an AC current flow through the first winding L. This causes a similar AC current to flow in the second winding of the transformer, and this AC current in the second winding is made to pass through a load. The control and drive circuitry that controls the high-side and low-side transistors is not shown.

In a first half cycle of the output sinusoidal AC current flowing in the winding L, the high-side transistor is controlled to be off. This is designated in FIG. 1A, FIG. 1B, FIG. 1C and FIG. 1D by the text "OFF" that appears by the high-side transistor QHS. The low-side transistor QLS, on the other hand, is switched on and off in such a way as to cause the sinusoidal AC current to flow through the first winding. Then in a second half cycle of the sinusoidal AC current flow, the low-side transistor QLS is controlled to be off. Operation of the inverter circuit in this second half cycle is not illustrated. In the second half cycle of the sinusoidal AC current flow, the high-side transistor QHS is switched on and off in such a way as to cause the sinusoidal AC current to flow.

Figure 1D:
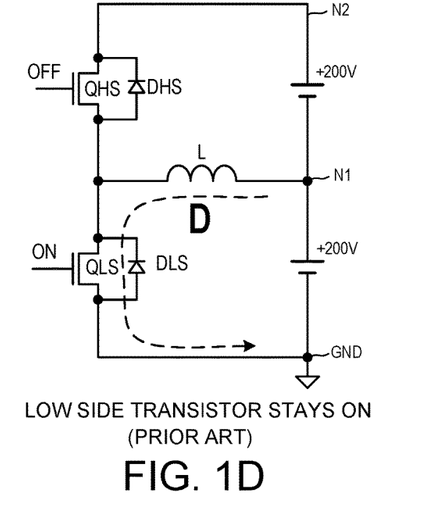
FIG. 1D (Prior Art) is a diagram that illustrates current flow in the inverter circuit of FIG. 1A at a subsequent time after the reverse recovery current flow in the body diode of the high-side transistor has subsided.

FIG. 1A, FIG. 1B, FIG. 1C and FIG. 1D illustrate current flows during an exemplary first half cycle of the sinusoidal AC current. FIG. 1A illustrates a first situation. The low-side transistor QLS is controlled to be on. Current is made to flow as illustrated by arrow A. The current flows from node N1, through the winding L, through the transistor QLS, and to the ground node GND. After a period of time, the low-side transistor QLS is turned off. This gives rise to the situation illustrated in FIG. 1B. Since the current cannot stop instantaneously in the inductance of the first winding L, and because it also cannot flow through the blocking low-side transistor QLS, it flows in the path illustrated by arrow B. The high-side transistor QHS is off, but the current B flows through the body diode DHS up to node N2. After an amount of time, the low-side transistor QLS is turned on again. Current then flows as illustrated by arrow C in FIG. 1C. The low-side transistor QLS is on and conductive, so current flows from the node N1, through the winding L, through the low-side transistor QLS, and to the ground node GND. When the low-side transistor QLS first turned on, however, there is a reverse voltage applied across the body diode DHS of the high-side transistor. This causes a short burst of reverse recovery current to flow through the body diode DHS. This burst of reverse recovery current flows in the path C illustrated in FIG. 1C. Once this reverse recovery current flow has stopped, then the current flow is as illustrated in FIG. 1D.

Current flow through body diode DHS can cause power losses in the switching converter. The surge of reverse recovery current illustrated in FIG. 1C, although of relatively short duration, is a large current and it occurs during a time when a large reverse voltage is present across the body diode. The integration over time of the instantaneous current flow through the body diode DHS multiplied by the instantaneous voltage drop across the body diode DHS represents energy loss. This is energy loss due to the flow of the reverse recovery current. In addition, there is an energy loss due to forward current flow through the body diode DHS. When the current B illustrated in FIG. 1B flows across the body diode DHS, there is about a one volt voltage drop across the body diode DHS. The integration of the instantaneous current flow through the body diode DHS multiplied by the instantaneous voltage drop across the body diode DHS represents energy loss.

SUMMARY

In a first novel aspect, a gate driver integrated circuit has a high-side gate driver and a low-side gate driver. The gate driver integrated circuit controls a high-side N-channel field effect transistor and a low-side N-channel field effect transistor of a DC-to-AC inverter circuit. The high-side transistor and the low-side transistor are parts of a switching leg or a phase-leg circuit. The source of the high-side transistor is coupled to the drain of the low-side transistor at a central switching node SW. One end of a large inductor or transformer winding is also coupled to the central switching node SW.

The gate driver integrated circuit has a VHSC1 input terminal upon which it receives a high-side driver digital control signal. When this VHSC1 input signal is driven to a high digital logic level, the high-side transistor is to be turned on. The gate driver integrated circuit also has a VLSC1 input terminal upon which it receives a low-side driver digital control signal. When this VLSC1 input signal is driven to a high digital logic level, the low-side transistor is to be turned on. The VHSC1 and VLSC1 input signals are digital logic signals that are typically supplied by a microcontroller integrated circuit onto the VHSC1 and VLSC1 input terminals of the gate driver integrated circuit, respectively.

When one of the transistors is being controlled to be off and nonconductive by the microcontroller, but when a current nevertheless is made to flow through the body diode of the transistor due to the inductive load, then this current condition it detected. If the current flowing through the body diode is detected to exceed a predetermined current threshold, then the driver integrated circuit controls the transistor to turn on. The transistor is turned on by the gate driver integrated circuit even though the incoming digital control signal as received from the microcontroller indicates that the microcontroller wants that transistor to be off. Current that would otherwise flow through the body diode therefore flows through the parallel-connected conductive transistor. When the other transistor of the switching leg is then controlled by the microcontroller to turn on, the gate driver integrated circuit detects this situation and first takes action to turn the conductive transistor off. The gate driver integrated circuit monitors the gate-to-source voltage of the transistor that is being turned off. When the gate driver integrated circuit detects that the gate-to-source voltage of the transistor has dropped below a predetermined threshold voltage, then the gate driver integrated circuit controls the other transistor of the switching leg to turn on and to become conductive. In this way, a shoot through current that otherwise might flow in a current path through a conductive high-side transistor and then through a conductive low-side transistor is avoided. The monitoring of the gate-to-source voltage of the transistor being turned off allows the timing of the turn on of the other transistor to be optimized.

By having a transistor turned on during a time when a current would otherwise be flowing through its body diode, power losses in the body diode are reduced. The magnitude of reverse recovery current that would otherwise occur at subsequent diode commutation is reduced. Also forward conduction losses through the diode are reduced because some of the forward current that would have otherwise flowed through the body diode and across a larger voltage drop will, as a result of the parallel-coupled conductive transistor, flow through the conductive transistor across a smaller voltage drop. Both effects (namely, the shunting of some forward current across a smaller voltage drop of a conductive transistor and the reduction in the magnitude of reverse recovery current in the body diode) serve to reduce losses in the body diode.

If, due to the way the high-side and low-side transistors are being controlled, the body diode of the high-side transistor is conducting current, then the novel gate driver integrated circuit controls the high-side transistor to be on and conductive during these times. The gate driver integrated circuit operates to reduce losses in the body diode of the high-side transistor. If, on the other hand, due to the way the high-side and low-side transistors are being controlled, the body diode of the low-side transistor is conducting current, then the novel gate driver integrated circuit controls the low-side transistor to be on and conductive during these times. The gate driver integrated circuit operates to reduce losses in the body diode of the low-side transistor.

In another novel aspect, a gate driver integrated circuit has only one gate driver circuit. The gate driver circuit is for driving a power field effect transistor that is part of another semiconductor die. The body diode of the power field effect transistor is also part of the other semiconductor die. The gate driver integrated circuit comprises a driver digital control signal input terminal, a driver output terminal, the gate driver circuit, a body diode current flow monitoring means, and a means for turning the power field effect transistor off. The gate driver circuit outputs a gate driver output signal onto the driver output terminal, and in this way drives the gate of the power field effect transistor so as to turn the power field effect transistor on if a digital signal of a predetermined digital logic value is present on the driver digital control signal input terminal. The body diode current flow monitoring means is for determining when a current flow through the body diode rises above a predetermined threshold current during a time when the gate driver circuit is controlling the power field effect transistor to be off, and for causing the power field effect transistor in response to the determining to be turned on such that the power field effect transistor is on even though a digital signal of the predetermined digital logic value is not present on the driver digital control signal input terminal. The means for turning the power field effect transistor off is for turning the power field effect transistor off in response to a transition of a second digital control signal. The transition of the second digital control signal occurs during a time when the power field effect transistor is on but the digital signal on the driver digital control signal input terminal is not at the predetermined digital logic value. The second digital control signal may, for example, be a digital control signal that is to control another external discrete power field effect transistor device. The second digital control signal may, for example, be received onto the gate driver integrated circuit by a dedicated input terminal.

Further details and embodiments and methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings. The terms "digital logic level" and "digital logic value" are used interchangeably in this patent document.

Figure 2:
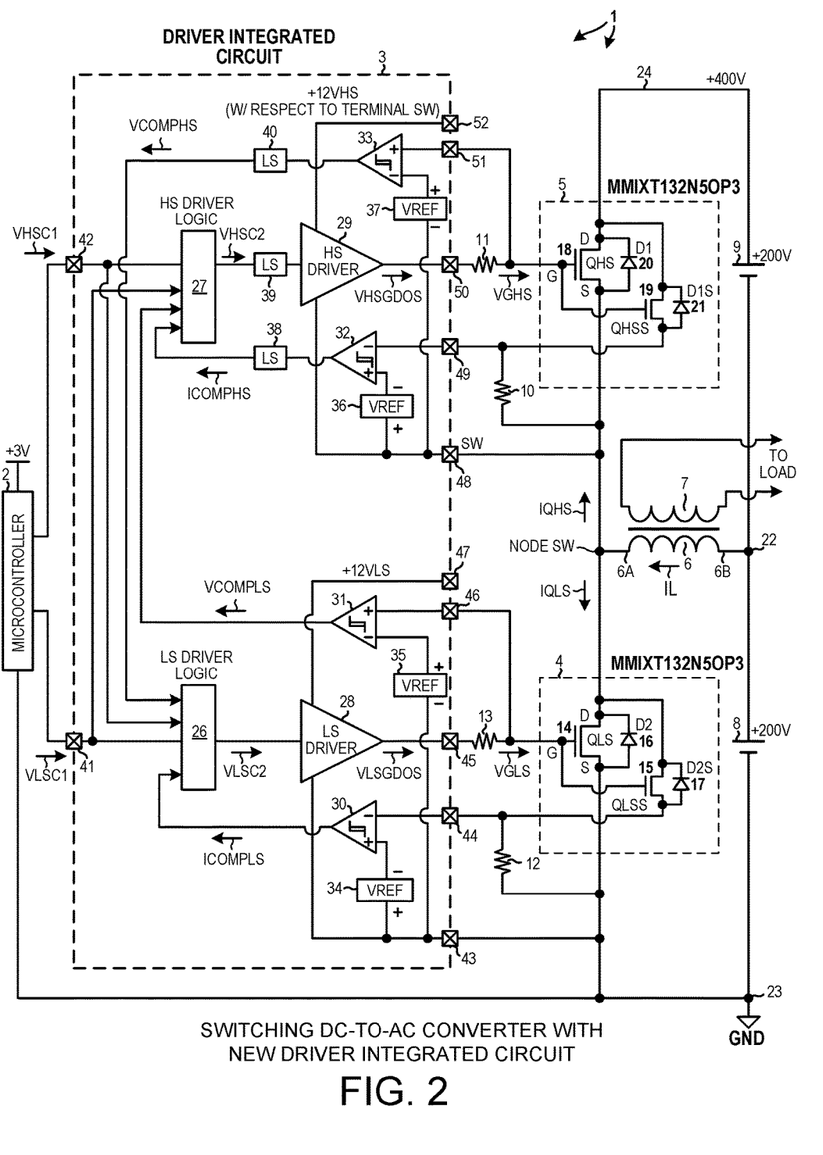
FIG. 2 is a diagram of a switching DC-to-AC inverter circuit that includes a novel driver integrated circuit in accordance with one novel aspect.

FIG. 2 is a diagram of a DC-to-AC inverter circuit system 1 in accordance with one novel aspect. The DC-to-AC inverter system 1 includes a microcontroller integrated circuit 2, a driver integrated circuit 3, a low-side transistor device 4, a high-side transistor device 5, a transformer including a first winding 6 and a second winding 7, a first voltage source 8, a second voltage source 9, a high-side current sense resistor 10, a current limiting gate resistor 11 for the high-side transistor device, a low-side current sense resistor 12, and a current limiting gate resistor 13 for the low-side transistor device.

The low-side transistor device 4 and the high-side transistor device 5 are identical devices. In one example, these devices are instances of a MMIXT132N5OP3 device available from IXYS Corporation of 1590 Buckeye Drive, Milpitas, Calif. The low-side transistor device 4 includes a low-side N-channel field effect transistor QLS 14 and a smaller current sense N-channel field effect transistor QLSS 15. Reference numeral 16 identifies the body diode D2 of the low-side transistor 14. Reference numeral 17 identifies the body diode D2S of the current sense transistor 15. The gates of transistors 14 and 15 are coupled together. The drains of transistors 14 and 15 are coupled together. The current sense transistor 15 is much smaller than the main transistor 14. The current sense transistor 15 is provided on the same semiconductor die along with the main low-side transistor so that the current flow through the current sense transistor 15 will be proportional to the current flow through the main low-side transistor 14.

The high-side transistor device 5 includes a high-side N-channel field effect transistor 18 and a smaller current sense N-channel field effect transistor 19. Reference numeral 20 identifies the body diode D1 of the high-side transistor 18. Reference numeral 21 identifies the body diode D1S of the current sense transistor 19. The gates of transistors 18 and 19 are coupled together. The drains of transistors 18 and 19 are coupled together.

The first voltage source 8 provides a +200 DC voltage on node 22. This +200 volts is with respect to ground potential on ground node GND 23. The first voltage source 8 can, for example, be a stack of batteries or another voltage source with a large capacitor coupled in parallel. The second voltage source 9 provides a +200 DC voltage on node 24. This +200 volts is with respect to the +200 volt potential on node 22. Accordingly, there is a +400 volt DC potential on node 24 with respect to ground potential on ground node GND 23. The second voltage source 9 can, for example, be a stack of batteries or another voltage source with a large capacitor coupled in parallel.

The drain of the high-side transistor 18 is coupled to node 24. The source of the high-side transistor 18 is coupled to the drain of the low-side transistor 14 at the SW node 25. The source of the low-side transistor 14 is coupled to the ground node GND 23. A first end 6A of the winding 6 is coupled to and is part of the switching node SW 25. A second end 6B of the winding 6 is coupled to and is part of the node 22.

The driver integrated circuit 3 includes low-side gate driver logic circuit 26, high-side gate driver logic circuit 27, low-side gate driver circuit 28, high-side gate driver circuit 29, a high-side current sense comparator 32, a high-side voltage sense comparator 33, a low-side current sense comparator 30, a low-side voltage sense comparator 31, voltage reference circuits 34-37, level shift circuits 38-40, a VLSC1 low-side driver digital control signal input terminal 41, a VHSC1 high-side driver digital control signal input terminal 42, a ground terminal 43, a low-side current sense input terminal 44, a low-side driver output terminal 45, a low-side voltage sense input terminal 46, a low-side driver supply voltage terminal 47, a SW node terminal 48, a high-side current sense input terminal 49, a high-side driver output terminal 50, a high-side voltage sense input terminal 51, and a high-side driver supply voltage terminal 52. These terminals are package terminals of a semiconductor device package that contains the circuitry of the driver integrated circuit 3. For each package terminal there is an associated integrated circuit die terminal (for example, bond pad). The terminal symbols in FIG. 2 represent both the package terminals as well as their associated integrated circuit die terminals.

In operation, the driver circuit integrated circuit 3 receives a digital low-side control signal VLSC1 from the microcontroller 2. When this VLSC1 low-side driver control signal has a low digital logic level, then the microcontroller 2 is controlling the low-side gate driver circuit 28 to drive a positive voltage onto the gate of the low-side transistor QLS 14 such that the low-side transistor QLS 14 is turned on and is conductive. Likewise, the driver integrated circuit 3 receives a digital high-side control signal VHSC1 from the microcontroller 2. When this VHSC1 control signal has a high digital logic level, then the microcontroller 2 is controlling the high-side gate driver circuit 29 to drive a positive voltage onto the gate of the low-side transistor QHS 18 such that the high-side transistor QHS 18 is turned on and is conductive.

When this VLSC1 low-side driver digital control signal as received from the microcontroller 2 has a low digital logic level, then it might be thought that the driver integrated circuit 3 would always control the low-side gate driver circuit 28 to drive a low voltage onto the gate of the low-side transistor QLS 14 such that the low-side transistor QLS 14 is turned off and is nonconductive, but this is not always true in accordance with the present invention. As explained below in further detail, the driver integrated circuit 3 detects if there is a forward current flow through the body diode 16 of the low-side transistor 14, and in that condition drives a high voltage onto the gate of the low-side transistor QLS 14 such that the low-side transistor QLS 14 is turned on. The low-side transistor QLS 14 is therefore turned on even though the VLSC1 low-side driver digital control signal received from the microcontroller 2 is at a low digital logic level. The turning on of the low-side transistor QLS 14 shunts current flow around the body diode 16, and reduces the voltage drop that would otherwise be across the body diode 16 during this time, and thereby reduces power dissipation in the body diode 16. The low-side transistor QLS 14 being on also serves to reduce the magnitude of a reverse recovery current if the body diode 16 were then to be quickly commutated. The low-side transistor QLS 14 is, however, controlled so that it is not on and conductive during a time when the high-side transistor QHS 18 is being controlled to be on and conductive.

Similarly, when the VLHC1 high-side driver digital control signal as received from the microcontroller 2 has a low digital logic level, then it might be thought that the driver integrated circuit 3 would always control the high-side gate driver circuit 29 to drive a low voltage onto the gate of the high-side transistor QHS 18 such that the high-side transistor QHS 18 is turned off and is nonconductive, but this is not always true in accordance with the present invention. As explained below in further detail, the driver integrated circuit 3 detects if there is a forward current flow through the body diode 20 of the high-side transistor 18, and in that condition drives a high voltage onto the gate of the high-side transistor QHS 18 such that the high-side transistor QHS 18 is turned on. The high-side transistor QHS 18 is therefore turned on even though the VHSC1 high-side driver digital control signal received from the microcontroller 2 is at a low digital logic level. The turning on of the high-side transistor QHS 18 shunts current flow around the body diode 20, and reduces the voltage drop that would otherwise be across the body diode 20 during this time, and thereby reduces power dissipation in the body diode 20. The high-side transistor QHS 18 being on also serves to reduce the magnitude of a reverse recovery current if the body diode 20 were then to be quickly commutated. The high-side transistor QHS 18 is, however, controlled so that it is not on and conductive during a time when the low-side transistor QLS 14 is being controlled to be on and conductive.

Figure 3:
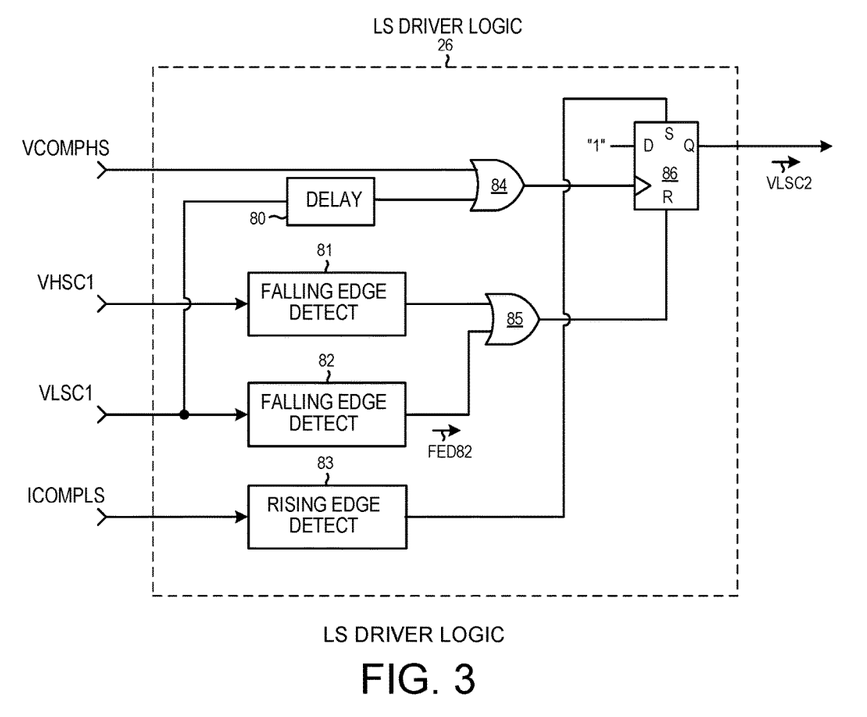
FIG. 3 is a block diagram of the low-side driver logic circuit of the driver integrated circuit of FIG. 2.

FIG. 3 is a block diagram of one example of the circuitry of the LS driver logic 26. The LS driver logic 26 includes a delay circuit 80, two falling edge detect circuits 81 and 82, a rising edge detect circuit 83, two OR gates 84 and 85, and a flip-flop 86. The rising and falling edge detect circuits are one-shot circuits.

Figure 4:
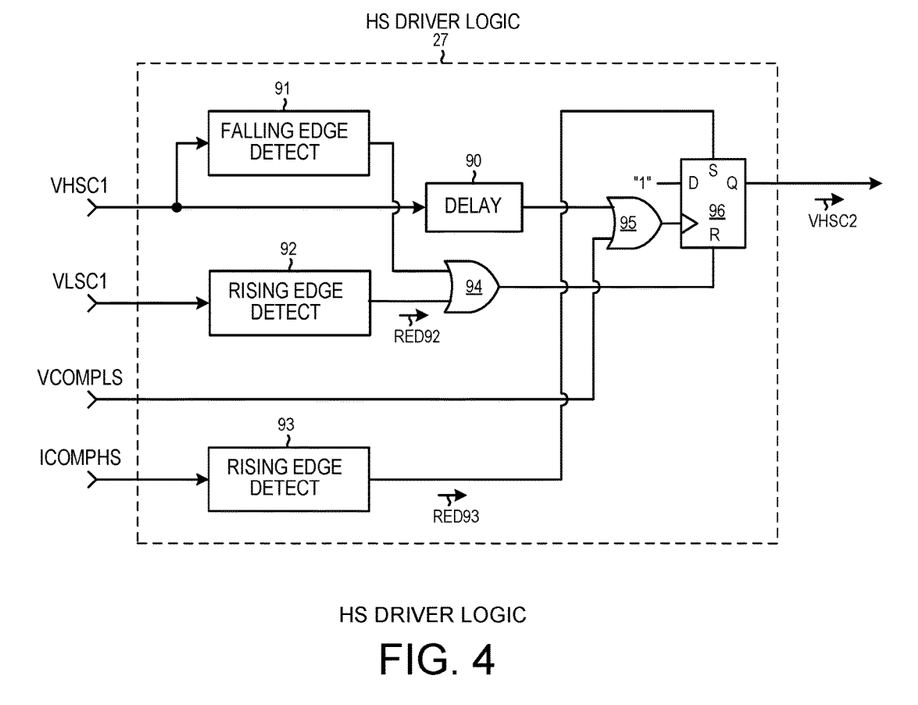
FIG. 4 is a block diagram of the high-side driver logic circuit of the driver integrated circuit of FIG. 2.

FIG. 4 is a block diagram of one example of the circuitry of the HS driver logic 27. The HS driver logic 27 includes a delay circuit 90, a falling edge detect circuit 91, two rising edge detect circuits 92 and 93, two OR gates 94 and 95, and a flip-flop 96. The rising and falling edge detect circuits are one-shot circuits.

Figure 5:
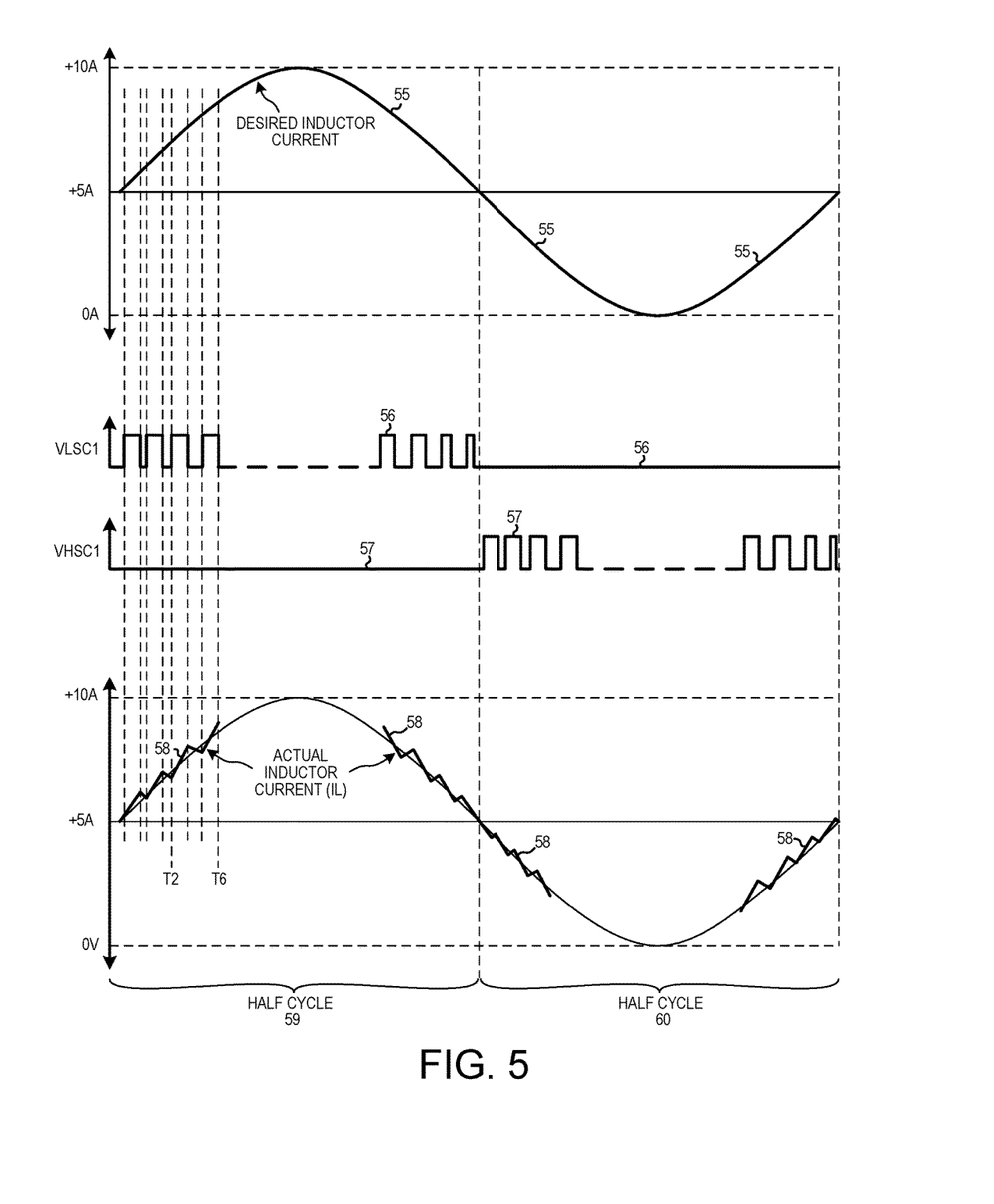
FIG. 5 is a waveform diagram that illustrates operation of the DC-to-AC inverter circuit of FIG. 2.

FIG. 5 is a waveform diagram that illustrates operation of the DC-to-AC inverter circuit of FIG. 2. The top waveform 55 represents the desired sinusoidal AC current flow that the DC-to-AC inverter circuit is driving through the winding 6. This winding current is also referred to as an inductor current, and is denoted IL. The second waveform VLSC1 56 represents the VLSC1 low-side driver digital control signal as received by the driver integrated circuit 3 on terminal VLSC1 41. The third waveform VHSC1 57 represents the VHSC1 digital control signal as received by the driver integrated circuit 3 on terminal VHSC1 42. The bottom waveform 58 represents the actual AC current flow that the DC-to-AC inverter circuit is driving through the winding 6. The actual inductor current IL does not have a perfectly sinusoidal waveshape, but it approximates a sinusoidal waveshape. During the first half cycle 59 of the inductor current sinewave, the VLSC1 low-side driver control signal transitions up and down as controlled by the microcontroller 2, but the VHSC1 control signal remains at a digital logic low level. Note that when the VLSC1 low-side driver control signal is at a digital logic high level, then the magnitude of the inductor current IL in the bottom waveform rises. Note that when the VLSC1 low-side driver control signal is at a digital logic low level, then the magnitude of the inductor current IL in the bottom waveform falls. The timing and duty cycle of the pulses of the VLSC1 low-side driver control signal are such that the resulting inductor current flow in the bottom waveform 58 approximates the ideal sinusoidal wave shape.

During the second half 60 of the inductor current sinewave, the VHSC1 control signal transitions up and down as controlled by the microcontroller 2, but the VLSC1 low-side driver control signal remains at a digital logic low level. Note that when the VHSC1 control signal is at a digital logic high level, then the magnitude of the inductor current IL in the bottom waveform falls. Note that when the VHSC1 control signal is at a digital logic low level, then the magnitude of the inductor current IL in the bottom waveform rises. The timing and duty cycle of the pulses of the VHSC1 control signal are such that the resulting inductor current flow has the desired sinusoidal wave shape.

Figure 6:
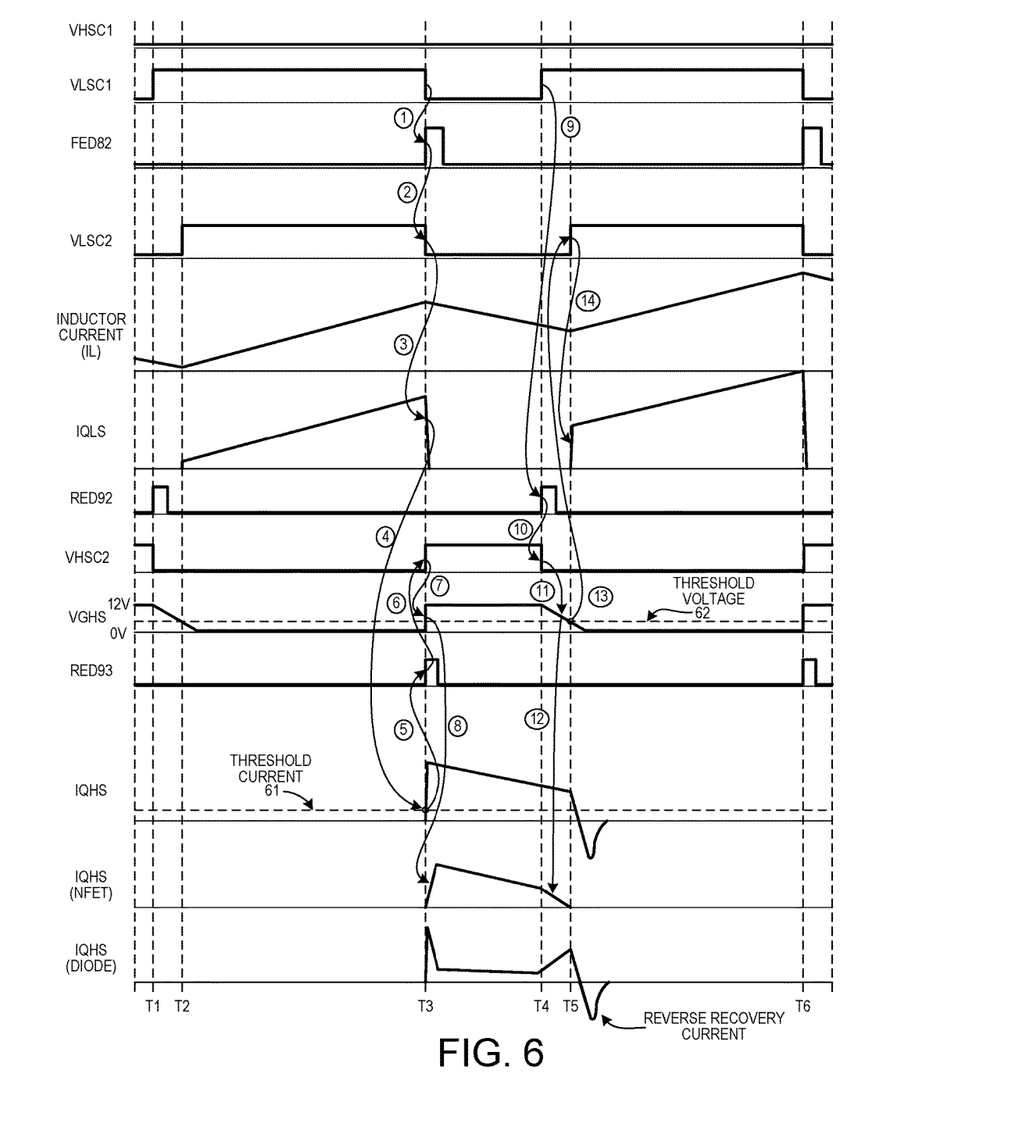
FIG. 6 is a simplified waveform diagram that illustrates the time period between time T2 and time T6 of FIG. 5 in more detail. The waveform diagram is a simplification. For a more accurate understanding of the waveforms, the circuit should be fabricated and the actual signals in the actual circuit should then be monitored and examined with testing equipment.

FIG. 6 shows the time period between time T1 and time T6 in further detail. The upper two waveforms of FIG. 6 represent the digital control signals VHSC1 and VLSC1 received by the driver integrated circuit 3 from the microcontroller 2. Because the time period between T1 and T6 occurs during the first half cycle 59 of the output inductor current IL, the microcontroller 2 is holding the high-side control signal VHSC1 at a digital logic low level. The fourth waveform labeled VLSC2 is the voltage signal output by the low-side driver logic circuit 26 onto the input lead of the low-side gate driver circuit 28. When the low-side driver digital control signal VLSC1 is at a high digital logic level between times T2 and T3, the low-side gate driver circuit 28 is driving a 12 volt VGS voltage onto the gate of the low-side transistor QLS 14. The low-side transistor QLS 14 is therefore on and conductive. The inductor current IL is therefore rising between times T2 and T3 as illustrated in the fifth waveform labeled "INDUCTOR CURRENT (IL)". At time T3, however, the microcontroller 2 causes the VLSC1 low-side driver control signal to transition to a digital logic low level. This falling edge is detected by the falling edge detector 82 in the LS driver logic 26. The detection of the falling edge is denoted in FIG. 6 by the arrow labeled with the circled "1". The pulse illustrated in the third waveform illustrates the signal FED82 output by this falling edge detector 82. As a result of this detection, the low-side driver logic 26 outputs a digital logic low signal VLSC2 to the low-side gate driver circuit 28. The low-side gate driver circuit 28 in turn drives the gate voltage VGS on the low-side transistor QLS 14 down to zero volts. This is denoted in FIG. 6 by the arrow labeled with the circled "2". When the voltage on the gate of the low-side transistor QLS 14 is driven low, the low-side transistor QLS 14 is made to turn off. This is denoted in FIG. 6 by the arrow labeled with the circled "3". The current IQLS flowing through the low-side transistor QLS as represented by the sixth waveform drops to zero. The current IL that was flowing through the large inductance of the transformer winding 6, however, cannot stop immediately, so the current IL is diverted upward from the SW node 25, and to high-side transistor device 5. The high-side transistor QHS 18 at this time is off, so the current flows through the body diode D1 20 to node 24. This sudden increase in the current IQHS flowing from the SW node 25 upward to the high-side transistor device 5 is denoted in FIG. 6 by the arrow labeled with the circled "4". The rise in current at time T3 is illustrated in the waveform labeled IQHS. When this current IQHS exceeds a predetermined threshold current 61, then the comparator 32 outputs a digital logic high signal. This signal, after level shifting by level shift circuit 38, is the signal ICOMPHS. The rising edge of the signal ICOMPHS is detected by the rising edge detector 93 in the high-side driver logic 27. This is denoted in FIG. 6 by the arrow labeled with the circled "5". The rising edge detector 93 detects the rising edge of the signal ICOMPHS, and outputs a high pulse of the signal RED93. The signal RED93 is supplied onto the set input lead of flip-flop 96, so the flip-flop 96 in the high-side driver logic 27 is set, and the high-side driver logic circuit 27 asserts its output signal VHSC2 to a high digital logic level. This is denoted in FIG. 6 by the arrow labeled with the circled "6". The high-side gate driver circuit 29 in turn drives a 12 volt gate voltage (Vgs) onto the gate of the high-side transistor QHS 18. This is denoted in FIG. 6 by the arrow labeled with the circled "7". The 12 volt VGS voltage on the gate of the high-side transistor 18 (with respect to the voltage on the SW node) causes the high-side transistor QHS 18 to turn on. This is denoted in FIG. 6 by the arrow labeled with the circled "8". As indicated by the IQHS(NFET) waveform, the high-side transistor QHS 18 conducts current. This current reduces the magnitude of current flowing through the body diode D1 20 as illustrated in the bottom waveform labeled IQHS (DIODE). Note that when the current IQHS(NFET) increases, the current IQHS(DIODE) decreases in a corresponding fashion. The high-side transistor QHS 18 is controlled to be on and conductive even though the incoming digital control signal VHSC1 on terminal 42 is at a digital logic low level.

This condition persists until the microcontroller 2 asserts the low-side driver digital control signal VLSC1 to a digital logic high level at time T4. The driver integrated circuit 3 detects the rising edge of the low-side driver digital control signal VLSC1, but it does not immediately control the low-side transistor QLS 14 to turn. Rather, it first controls the high-side transistor QHS 18 to turn off. First, the rising edge detector 92 in the high-side driver logic 27 detects the rising edge of the VLSC1 low-side driver control signal. This is denoted in FIG. 6 by the arrow labeled with the circled "9". The pulse illustrated in the seventh waveform RED92 of FIG. 6 represents a pulse as output by this rising edge detector 92. In response, the high-side driver logic 27 forces the VHSC2 control signal to a digital logic low level. This is denoted in FIG. 6 by the arrow labeled with the circled "10". This causes the voltage on the gate of the high-side transistor 18 to decrease. This is denoted in FIG. 6 by the arrow labeled with the circled "11". The voltage signal VGHS on the gate of the high-side transistor 18 decreases at a rate determined by the resistance of resistor 11 and the gate-to-source capacitance of the high-side transistor device 5. Due to resistor 11 and the gate capacitance of the high-side transistor, the voltage of signal VHSGDOS on terminal 50 is not the same as the voltage of signal VGHS on the gate of the high-side transistor QHS 18. As the voltage of signal VGHS on the gate of the high-side transistor QHS 18 decreases, the current flow through the high-side transistor QHS 18 decreases. This is denoted in FIG. 6 by the arrow labeled with the circled "12". When the voltage VGHS on the gate of the high-side transistor QHS 18 drops below a predetermined threshold voltage 62, then the comparator 33 asserts its output signal to a high digital logic level. After level shifting, this signal is the digital signal VCOMPHS. This low-to-high signal transition of the digital signal VCOMPHS causes the flip-flop 86 to clock in a digital high value. The control signal VLSC2 therefore transitions to a high digital logic value. This is denoted in FIG. 6 by the arrow labeled with the circled "13". This causes the low-side transistor QLS 14 to turn on, and causes the inductor current IL to be redirected downward from the SW node 25, through the low-side transistor QLS 14, and to the ground node GND 23. This is denoted in FIG. 6 by the arrow labeled with the circled "14". From time T5 on to time T6, the current flow through low-side transistor QLS 14 increases as shown by the waveform labeled IQLS in FIG. 6.

Accordingly, when the low-side transistor QLS 14 is first controlled to turn off during the first half cycle 59, the rapid increase in current flow through the body diode D1 20 of the high-side transistor is detected. This detection is used as a trigger to turn on the high-side transistor QHS 18. Current flow that would otherwise pass through the body diode D1 20 passes through the high-side transistor QHS 18. This reduces power losses that would otherwise occur in the body diode D1 20. The high-side transistor QHS 18 continues to be controlled to be on and conductive until the driver integrated circuit 3 receives a rising edge of the VLSC1 low-side driver digital control signal from the microcontroller 2. In response to this rising edge of the VLSC1 low-side driver digital control signal as received from the microcontroller 2, the driver integrated circuit 3 first controls the high-side transistor QHS 18 to turn off. When the gate-to-source voltage of the high-side transistor QHS 18 falls below a threshold voltage, then the driver integrated circuit 3 can turn on the low-side transistor QLS 14 without causing a shoot-through problem. Accordingly, in response to detecting that the VGS gate voltage on the high-side transistor QHS 18 has dropped below the threshold voltage, the driver integrated circuit 3 controls the low-side transistor QLS 14 to turn on. The low-side transistor QLS 14 is thereafter controlled to stay on and conductive as long as the VLSC1 low-side driver digital control signal as received from the microcontroller 2 continues to be high at a digital logic high value.

Figure 7:
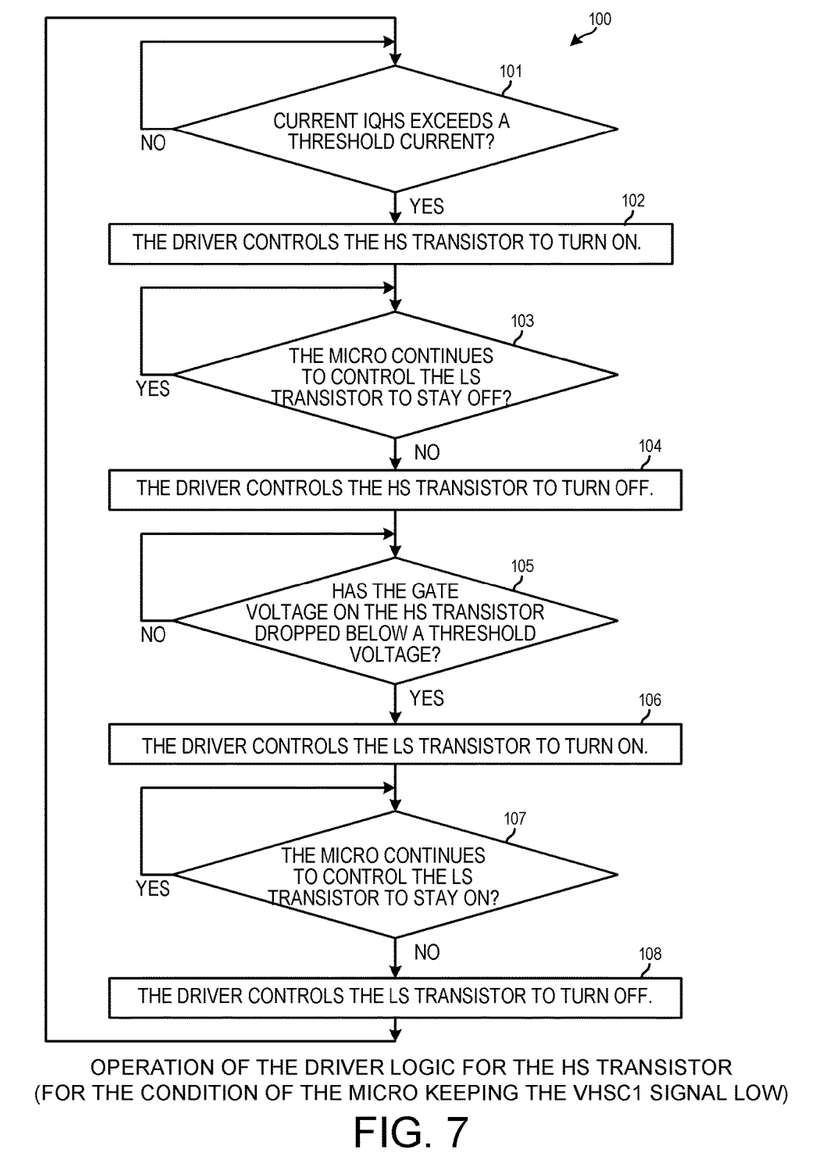
FIG. 7 is a flowchart of a method 100 in which the high-side transistor QHS is turned on to shunt current around the body diode D1 of the high-side transistor QHS, and to reduce losses due to reverse recovery current flow through the body diode D1

FIG. 7 is a flowchart of the method 100 set forth in the waveform diagram of FIG. 6. This method 100 pertains to operation of the driver integrated circuit 3 during the first half cycle 59 of the sinusoidal AC output current IL. Initially, at a time such as time T3 in FIG. 6, the low-side transistor QLS 14 is on. The VHSC1 high-side driver digital control signal is at a digital logic low level and remains at this level throughout the method 100 of FIG. 7. The microcontroller 2 then deasserts the low-side driver control signal VLSC1 to a digital logic low level. This causes the low-side transistor QLS 14 to turn off, and causes the flow of inductor current IL to be redirected upward from the SW node 25 to the high-side transistor device 5. The current IQHS therefore increases. When the current IQHS is detected by the comparator 32 to exceed a threshold current (step 101), then driver integrated circuit 3 controls the high-side transistor QHS 18 to turn on (step 102). In the example of FIG. 2, this detection is done indirectly by detecting whether current flow through sense body diode D1S 21 exceeds a threshold current. The high-side transistor QHS is being controlled by the driver integrated circuit 3 to be on even though the microcontroller 2 is keeping the VHSC1 signal at digital logic low level. As long as the microcontroller 2 continues to control the low-side transistor QLS 14 to stay off, the driver integrated circuit 3 continues to control the high-side transistor QHS 18 to remain turned on and conductive. This shunts current flow around the body diode D1 20. The shunt current flows through the high-side transistor QHS. When the microcontroller 2 then asserts the VLSC1 low-side driver digital control signal to a digital logic high level to turn on the low-side transistor QLS 14 (step 103), then the driver integrated circuit 3 first controls the high-side transistor QHS 18 to turn off (step 104). When the voltage VGS on the gate of the high-side transistor QHS 18 is detected by comparator 33 to have dropped below a threshold voltage (step 105), then the driver integrated circuit 3 asserts the "low-side gate driver output signal" (VLSGDOS) onto terminal 45. This causes the low-side transistor QLS 14 to turn on (step 106). As long as the microcontroller 2 continues to assert the VLSC1 low-side driver control signal to a digital logic high level, the driver integrated circuit 3 continues to drive a high gate-to-source voltage signal VGLS onto the gate of the low-side transistor QLS 14. When the microcontroller 2 then deasserts the VLSC1 low-side driver control signal to a digital logic low level (step 107), then the driver integrated circuit 3 controls the low-side transistor QLS 14 to turn off (step 108), and the steps 101 through 108 repeat.

In addition to reducing power losses during the first half cycle 59 of FIG. 5, the driver integrated circuit 3 also operates in a similar fashion to reduce losses during the second half cycle 60 of FIG. 5. During the second half cycle 60, the microcontroller 2 holds the VLSC1 low-side driver digital control signal at a fixed digital logic low level. The microcontroller 2, however, pulses the VHSC1 digital control signal such that the inductor current IL has the sinusoidal waveshape illustrated in FIG. 5. During this second half cycle 60, the high-side transistor QHS 18 is turned on at the control of the microcontroller 2 to push current IL through the winding 6. Such a pulse of current is in the opposite direction to the direction of the arrow denoted IL in FIG. 2, so the pulse of current is considered a negative IL current. The IL waveshape as it appears in the second half cycle 60 of FIG. 5 therefore involves the inductor current IL being negative. After such a pulse of negative IL current flowing through the high-side transistor QHS 18, the high-side transistor QHS 18 is turned off. This causes the flow of negative current to be redirected. It is redirected so that it flows through up from the ground node GND 23, through the body diode D2 16 of the low-side transistor QLS 14, to the SW node 25, and then through the winding 6 of the transformer to node 22. In one novel aspect, the driver integrated circuit 3 controls the low-side transistor QLS 14 to turn on during this time. Some of the current that would otherwise flow through the body diode D2 16 therefore flows through the conductive low-side transistor QLS 14. Then when the microcontroller 2 asserts the VHSC1 digital control signal to cause the high-side transistor QHS 18 to turn on, the driver integrated circuit 3 does not immediately drive a 12 volt VGS signal onto the gate of the high-side transistor QHS 18, but rather the low-side driver logic 26 first causes the low-side transistor QLS 14 to turn off. The driver integrated circuit 3 monitors the gate voltage signal VGLS (VGS) on the gate of the low-side transistor QLS 14. When gate voltage VGS on the gate of the low-side transistor QLS 14 is detected to have dropped below the voltage threshold 62, then the high-side driver logic 27 controls the high-side transistor QHS 18 to turn on.

The flowchart of FIG. 7 is for the condition of the microcontroller 2 keeping the VHSC1 signal at a digital logic low. If the microcontroller 2 were to assert the VHSC1 signal to a digital logic high, then the low-to-high transition would pass through delay element 90 of the high-side driver logic 27, and would pass through OR gate 95, and would clock the flip-flop 96. Due to the digital "1" being present on the D input of the flip-flop 96, the flip-flop 96 would clock in a digital logic high level, and the VHSC2 signal would be asserted to a digital logic high level. This would pass through the high-side driver 29, and would pass out of the driver integrated circuit 3, and would turn on the high-side transistor QHS. The delay in turning on the high-side transistor QHS provides time for the low-side transistor QLS to be turned off in the event the low-side transistor QLS is being controlled to be on by the driver integrated circuit 3 (to shunt current around its body diode D2 even though VLSC1 is low) as described above. In one embodiment, the driver integrated circuit 3 only allows the high-side transistor QHS to be turned on if the VGS on the low-side transistor QLS is below a threshold voltage.

Figure 8:
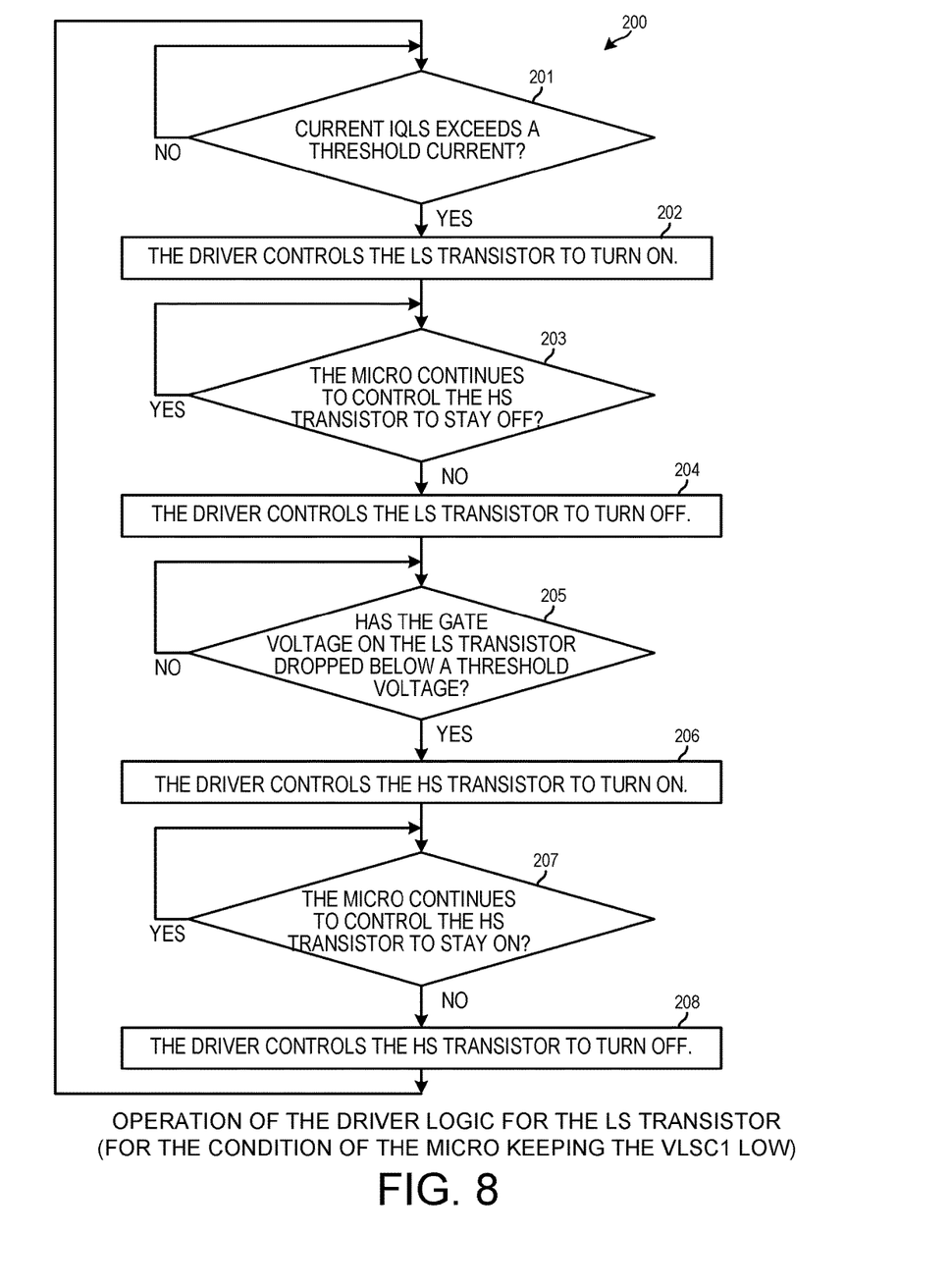
FIG. 8 is a flowchart of the method 200 in which the low-side transistor QLS is turned on to shunt current around the body diode D2 of the low-side transistor QLS, and to reduce losses due to reverse recovery current flow through the body diode D2.

FIG. 8 is a flowchart of a method 200 of operation of the driver integrated circuit 3 in a condition in which the microcontroller is switching the high-side transistor on and off, but is keeping the VSLC1 low. Initially, the microcontroller 2 is controlling the high-side transistor QHS 18 to be on and conductive. The VLSC1 low-side driver digital control signal is at a digital logic low level and remains at this level throughout the method 200 of FIG. 8. The microcontroller 2 then deasserts the digital control signal VHSC1 to a digital logic low level. In response to this, the driver integrated circuit 3 controls the high-side transistor QHS 18 to turn off. The turn off of the high-side transistor QHS 18 causes the flow of inductor current IL to be redirected. The flow of inductor current passes upward from the ground node GND 23, through the body diode D1 16 of the low-side transistor QLS 14, to SW node 25, and then through the winding 6 to the node 22. This flow of current is opposite to the arrow of the IQLS current, so this flow of current is considered a negative IQLC current. When the current IQLS is detected by the comparator 30 to exceed a threshold current (step 201), then driver integrated circuit 3 controls the low-side transistor QLS 14 to turn on (step 202). In the example of FIG. 2, this detection is done indirectly by detecting whether current flow through the body diode D2S 17 of the sense transistor exceeds a proportionate threshold current. As long as the microcontroller 2 continues to control the high-side transistor QHS 18 to stay off, the driver integrated circuit 3 continues to control the low-side transistor QLS 14 to remain turned on and conductive. This shunts current flow around the body diode D2 16. When the microcontroller 2 asserts the VHSC1 high-side driver digital control signal to a digital logic high level to turn on the high-side transistor QHS 18 (step 203), then the driver integrated circuit 3 first controls the low-side transistor QLS 14 to turn off (step 204). When the voltage signal VGLS (VGS) on the gate of the low-side transistor QLS 14 is detected by comparator 31 to have dropped below the threshold voltage (step 205), then the driver integrated circuit 3 asserts the "high-side gate driver output signal" (VHSGDOS) onto terminal 50. This causes the high-side transistor QHS 18 to turn on (step 206). As long as the microcontroller 2 continues to assert the VHSC1 high-side driver digital control signal to a digital logic high level, the driver integrated circuit 3 continues to drive a 12 volt gate-to-source voltage VGS onto the gate of the high-side transistor QHS 18. When the microcontroller 2 then deasserts the VHSC1 high-side driver digital control signal to a digital logic low level, then the driver integrated circuit 3 controls the high-side transistor QHS 18 to turn off (step 208), and the steps 201 through 208 repeat.

The flowchart of FIG. 8 is for the condition of the microcontroller 2 keeping the VLSC1 signal at a digital logic low. If the microcontroller 2 were to assert the VLSC1 signal to a digital logic high, then the low-to-high transition would pass through delay element 80 of the low-side driver logic 26, and would pass through OR gate 84, and would clock the flip-flop 86. Due to the digital "1" being present on the D input of the flip-flop 86, the flip-flop 86 would clock in a digital logic high level, and the VLSC2 signal would be asserted to a digital logic high level. This would pass through the low-side driver 28, and would pass out of the driver integrated circuit 3, and would turn on the low-side transistor QLS. The delay in turning on the low-side transistor QLS provides time for the high-side transistor QHS to be turned off in the event the high-side transistor QHS is being controlled to be on by the driver integrated circuit 3 (to shunt current around its body diode D1 even though VHSC1 is low) as described above. In one embodiment, the driver integrated circuit 3 only allows the low-side transistor QLS to be turned on if the VGS on the high-side transistor QHS is below a threshold voltage.

A microcontroller can control a high-side driver and a low-side driver in a complex manner based on many different sensor inputs including sensed currents and sensed voltages. It might be thought, therefore, that a clocked digital microcontroller can perform the function of the novel driver integrated circuit 3. This is not, however, generally so. In one embodiment, the microcontroller that controls the high and low side drivers of the gate driver integrated circuit 3 is clocked at a relatively slow clock rate. This relatively slow clocking of the microcontroller 3 is desirable for several reasons. The microcontroller 3 cannot, therefore, make the necessary current and/or voltage detections, and make decisions based on those detections, and respond by controlling the high and low side drivers as fast as is desired. The novel gate driver integrated circuit 3 therefore includes comparators 30-33 and associated circuitry thereby enabling the driver integrated circuit 3 to detect and respond to that detection faster and in the analog domain. The signal propagations indicated in FIG. 6 by arrows "1" through "8" and by arrows "9" through "14" are not slowed due to having to wait for a clock edge of a digital clock signal. The gate driver integrated circuit 3 does not include any clocked digital processor that fetches and executes instructions.

Figure 9:
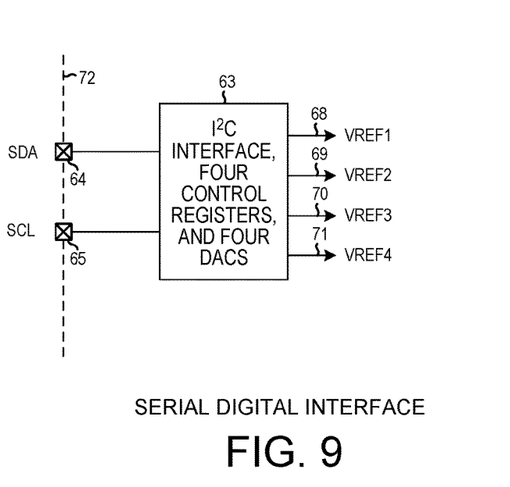
FIG. 9 is a diagram that illustrates a serial digital interface by which the driver integrated circuit 3 receives multi-bit digital control values from the microcontroller, where the multi-bit digital control values control threshold voltages (for example, threshold voltage 62) and threshold currents (for example, threshold current 61).

FIG. 9 illustrates a digital interface logic 63 and associated terminals 64 and 65 of the driver integrated circuit 3 of FIG. 2. The terminals 64 and 65 and digital interface logic 63 are not shown in the simplified diagram of FIG. 2. Digital interface logic 63 includes an I2C interface for receiving serial information from the microcontroller 2, four multi-bit digital control registers, and four corresponding digital-to-analog converters (DACs). Each of the voltage reference circuits 34-37 is one of these multi-bit control registers and its associated DAC. The multi-bit digital control value stored in the register is supplied to the DAC so that the DAC will in turn output the desired reference voltage. The microcontroller 2 supplies digital signals in serial fashion onto terminals SDA 64 and SCL 65, and thereby writes a multi-bit digital voltage control value into each of the four control registers, and thereby controls and sets each of the reference voltages output by the voltage reference circuits 34-37. Conductor 68 is coupled to the inverting input lead of comparator 33. Conductor 69 is coupled to the non-inverting input lead of comparator 32. Conductor 70 is coupled to the non-inverting input lead of comparator 31. Conductor 71 is coupled to the non-inverting input lead of comparator 30. Vertical dashed line 72 represents the left boundary of the driver integrated circuit 3 in FIG. 2. The reference voltages output by the voltage reference circuits 34-37 are therefore programmable by the microcontroller 2.

Although certain specific embodiments are described above for instructional purposes, the teachings of this patent document have general applicability and are not limited to the specific embodiments described above. Although this novel gate driver is most advantageously disposed on an integrated circuit that is separate from the microcontroller, the novel gate driver may also be disposed on the same integrated circuit along with a microcontroller. Accordingly, various modifications, adaptations, and combinations of various features of the described embodiments can be practiced without departing from the scope of the invention as set forth in the claims.

We claim:

1. A gate driver integrated circuit comprising:
 a high-side driver digital control signal input terminal;
 a high-side driver output terminal;
 a high-side gate driver circuit that outputs a high-side gate driver output signal onto the high-side driver output terminal;
 a low-side driver digital control signal input terminal;
 a low-side driver output terminal;
 a low-side gate driver circuit that outputs a low-side gate driver output signal onto the low-side driver output terminal;
 a high-side current sense input terminal;
 a high-side voltage sense input terminal;
 a low-side current sense input terminal;
 a low-side voltage sense input terminal;
 a high-side driver logic circuit that supplies a control signal to the high-side gate driver circuit and that receives a high-side driver digital control signal from the high-side driver digital control signal input terminal;
 a low-side driver logic circuit that supplies a control signal to the low-side gate driver circuit and that receives a low-side driver digital control signal from the low-side driver digital control signal input terminal;
 a high-side current sense circuit that receives a signal from the high-side current sense input terminal and that supplies a signal to the high-side driver logic circuit;
 a high-side voltage sense circuit that receives a signal from the high-side voltage sense input terminal and that supplies a signal to the low-side driver logic circuit;
 a low-side current sense circuit that receives a signal from the low-side current sense input terminal and that supplies a signal to the low-side driver logic circuit; and
 a low-side voltage sense circuit that receives a signal from the low-side voltage sense input terminal and that supplies a signal to the high-side driver logic circuit.

2. The gate driver integrated circuit of claim 1, wherein the high-side current sense circuit is a high-side current sense comparator, wherein the high-side voltage sense circuit is a high-side voltage sense comparator, wherein the low-side current sense circuit is a low-side current sense comparator, and wherein the low-side voltage sense circuit is a low-side voltage sense comparator.

3. The gate driver integrated circuit of claim 2, further comprising:
 a switching node input terminal;
 a first reference voltage circuit that supplies a first reference voltage to the high-side voltage sense comparator, wherein the first reference voltage is relative to a voltage on the switching node input terminal;
a ground node input terminal; and
a second reference voltage circuit that supplies a second reference voltage to the low-side voltage sense comparator, wherein the second reference voltage is relative to a voltage on the ground node input terminal.

4. A gate driver integrated circuit adapted for driving a low-side gate signal onto a gate of a low-side transistor and for driving a high-side gate signal onto a gate of a high-side transistor, wherein the high-side transistor has a body diode, the gate driver integrated circuit comprising:
a high-side driver digital control signal input terminal;
a high-side driver output terminal;
a high-side gate driver circuit that outputs a high-side gate driver output signal onto the high-side driver output terminal;
a low-side driver digital control signal input terminal;
a low-side driver output terminal;
a low-side gate driver circuit that outputs the low-side gate driver output signal onto the low-side driver output terminal;
body diode current flow monitoring circuitry coupled to the body diode of the high-side transistor;
high-side driver logic circuitry coupled to the low-side driver digital control signal input terminal and to the high-side transistor; and
$V_{GS}$ monitoring circuitry coupled to the high-side transistor and the low-side gate driver circuit.

5. The gate driver integrated circuit of claim 4, wherein the body diode current flow monitoring circuitry comprises a first comparator, wherein the first comparator outputs a first comparator output signal that is communicated to the high-side driver logic circuitry, wherein the $V_{GS}$ monitoring circuitry comprises a second comparator, wherein the second comparator outputs a second comparator output signal that is communicated to a low-side driver logic circuit, wherein the high-side driver logic circuitry receives a high-side driver digital control signal from the high-side driver control signal input terminal, and wherein the gate driver integrated circuit does not include any digital processor that fetches and executes instructions.

6. The gate driver integrated circuit of claim 5, wherein the body diode current flow monitoring circuitry further comprises a current sense input terminal and a reference voltage circuit, wherein a first differential input lead of the first comparator is coupled to the current sense input terminal, and wherein a second differential input lead of the first comparator is coupled to the reference voltage circuit.

7. The gate driver integrated circuit of claim 5, wherein the $V_{GS}$ monitoring circuitry further comprises a voltage sense input terminal and a reference voltage circuit, wherein a first differential input lead of the second comparator is coupled to the voltage sense input terminal, and wherein a second differential input lead of the second comparator is coupled to the reference voltage circuit.

8. The gate driver integrated circuit of claim 4, wherein the $V_{GS}$ monitoring circuitry is for detecting when a gate-to-source voltage on the high-side transistor has fallen below a predetermined threshold voltage and this falling of the gate-to-source voltage is due to the high-side driver logic circuitry causing the high-side transistor to be turned off, and wherein the high-side transistor was on and conductive immediately prior to this being turned off during a time when a digital logic low value was present on the high-side driver digital control signal input terminal.

9. The gate driver integrated circuit of claim 4, further comprising:
a serial digital interface circuit by which the gate driver integrated circuit receives a multi-bit digital control value, wherein the multi-bit digital control value sets a predetermined threshold current.

10. The gate driver integrated circuit of claim 4, further comprising:
a serial digital interface circuit by which the gate driver integrated circuit receives a multi-bit digital control value, wherein the multi-bit digital control value sets a predetermined threshold voltage.

* * * * *